(12) United States Patent
Marshall

(10) Patent No.: US 6,699,374 B2
(45) Date of Patent: Mar. 2, 2004

(54) LOW TEMPERATURE CATHODIC MAGNETRON SPUTTERING

(75) Inventor: Michael L. Marshall, Northfield, MN (US)

(73) Assignee: ATF Technologies, Inc., Van Nuys, CA (US)

( * ) Notice: Subject to any disclaimer, the term of this patent is extended or adjusted under 35 U.S.C. 154(b) by 0 days.

(21) Appl. No.: 09/918,248

(22) Filed: Jul. 30, 2001

(65) Prior Publication Data

US 2002/0063054 A1 May 30, 2002

Related U.S. Application Data

(63) Continuation-in-part of application No. 09/626,440, filed on Jul. 27, 2000, now abandoned.

(51) Int. Cl.[7] .............................................. C23C 14/35
(52) U.S. Cl. ......................... 204/298.14; 204/298.16; 204/298.09
(58) Field of Search ...................... 204/192.12, 298.12, 204/298.14, 298.16, 298.09

(56) References Cited

U.S. PATENT DOCUMENTS

| 3,803,019 A | 4/1974 | Robison et al. ............. 204/298 |
| 4,031,424 A | 6/1977 | Penfold et al. ............. 313/146 |
| 4,166,018 A | 8/1979 | Chapin ................... 204/192 R |
| 4,719,968 A | 1/1988 | Speros ........................ 165/154 |
| 5,082,546 A | 1/1992 | Szczyrbowski et al. ..................... 204/298.08 |
| 5,126,033 A | 6/1992 | Szczyrbowski et al. ..................... 204/298.08 |
| 5,147,498 A | 9/1992 | Nashimoto .................. 156/627 |
| 5,155,561 A | 10/1992 | Bozler et al. ................. 357/22 |

FOREIGN PATENT DOCUMENTS

| JP | 62-174376 | 7/1987 | ........... C23C/14/36 |

OTHER PUBLICATIONS

English translation of JP 62–174376.*

* cited by examiner

Primary Examiner—Steven H. VerSteeg
(74) Attorney, Agent, or Firm—Gary Schnittgrund; Law Offices of Gary Schnittgrund

(57) ABSTRACT

An apparatus and method for cathodic magnetron sputtering of a coating onto a temperature-sensitive substrate is disclosed. The apparatus consists of a vacuum chamber having a work-supporting station and a magnetron sputtering target opposite the work-supporting station. The apparatus produces a magnetic field to contain, in an oval pattern, a gas plasma cloud which ejects target material toward the work-supporting station. The temperature of the substrate being coated is controlled by positioning the cooling anode within the sputtering chamber. The position of the cooling anode is adjusted relative to the cathode target to capture primary electrons that would otherwise impinge the substrate. It is in a position with respect to the cathode that does not interfere with the magnetic field.

10 Claims, 4 Drawing Sheets

LOW TEMPERATURE CATHODIC MAGNETRON SPUTTERING

CROSS-REFERENCE TO RELATED APPLICATIONS

This is a continuation-in-part of application Ser. No. 09/626,440, filed Jul. 27, 2000, which is incorporated herein by reference, now abandoned.

FIELD OF THE INVENTION

This invention relates to a method and apparatus for the sputtering of coatings from a cathodic magnetron sputtering device upon temperature-sensitive substrates such as plastic ophthalmic lenses.

BACKGROUND OF THE INVENTION

Plastic ophthalmic lenses such as eyeglass lenses have become popular in recent years, due particularly to their light weight. Coatings commonly are applied to the lenses for any of a number of reasons. Antireflective coatings, for example, reduce the reflected light from the lens surfaces. Other coatings increase the hardness and scratch resistance of plastic lens surfaces. Yet other coatings are used to provide small amounts of color to the lenses, either for cosmetic purposes or to reduce the incidence of radiation of particular wavelengths, e.g., UV light.

Ophthalmic lenses commonly are made from lens blanks, and coatings are applied to the lens blanks by applying a coating liquid to the lens blanks as by spraying, dipping, etc. Depending on the coating desired, the coating process may require a series of sequential steps, followed by drying, irradiating with light to cross-link polymers in the coating, etc. As a result, the coating process is relatively slow, and great care must be taken to preserve the desired characteristics of the coating solutions. Antireflective coatings, consisting typically of a series of metal oxide layers having alternating high and low indices of refraction, commonly are applied to lens blanks by batch-processing vacuum deposition techniques in which the temperature of the lens blanks can be controlled.

Magnetron sputtering techniques have been used for applying coatings to temperature-resistant substrates such as glass. In ordinary magnetron sputtering techniques, a temperature-resistant substrate to be coated is exposed to a magnetron sputtering target in a high vacuum environment, and molecules of the target material are ejected from the target to impinge upon and coat the substrate. The loss of electrons to the substrate also causes the temperature of the substrate to rise. When temperature-sensitive materials such as polymers are attempted to be coated in this manner, the impingement of electrons on the polymer rapidly heats the substrate. The heat capacity of polymers commonly is substantially less than that of glass. Moreover, plasma temperatures can rise substantially. As a result, magnetron sputtering of coatings onto the surfaces of temperature-sensitive materials such as polymer lens blanks has not gained favor because of the tendency of such materials to soften and deform at elevated temperatures.

It would be desirable to provide a magnetron sputtering apparatus that would enable temperature-sensitive materials such as polymer lens blanks to be successfully coated without being unduly heated.

SUMMARY OF THE INVENTION

I have found that substrate heating in magnetron sputtering devices occurs primarily through the impingement of primary electrons on the substrate, that is, electrons that generally are not trapped in the magnetic field. Moreover, I have found that electron impingement on the substrate can be largely avoided by placing a cooling anode within the sputtering chamber in a position close enough to the cathode target to capture primary electrons not captured in the magnetic field and that otherwise would impinge upon the substrate, but yet oriented, with respect to the cathode, in a field noninterfering position; that is, in a position that does not cause interference with magnetic flux lines and thus produces no significant effect upon sputtering erosion patterns in the target or sputtering uniformity.

Thus, my invention in one embodiment provides an apparatus for the cathodic magnetron sputtering of a temperature-sensitive substrate. The apparatus comprises a vacuum chamber having a work supporting station and a magnetron sputtering target in sputtering opposition to the work supporting station. The apparatus produces a magnetic field serving to contain, in an oval pattern, a gas plasma cloud to eject target material toward the work supporting station.

The apparatus includes an anode that is carried between the target and the work supporting station sufficiently out of said magnetic field so as to produce no significant effect upon the magnetic field or sputtering erosion patterns but yet sufficiently near the target as to collect electrons not captured by the magnetic field and that otherwise would impinge upon and heat a substrate supported by the work supporting station. In a preferred embodiment, the anode is externally fluid-cooled preferably by an external source of liquid coolant that is supplied to the anode during the coating operation.

In another embodiment, my invention provides a method for cathodic magnetron sputtering of target material on the surface of heat-sensitive substrates in a magnetron sputtering apparatus that includes a vacuum chamber having a work-supporting station and a magnetron sputtering target in sputtering opposition to said work supporting station. The apparatus produces a magnetic field serving to contain, in an oval pattern, a gas plasma cloud to eject target material toward the work-supporting station. The method comprises the steps of:

a. providing within the vacuum chamber an anode carried adjacent but out of the oval pattern, b. positioning the anode sufficiently out of the magnetic field so as to have no significant effect upon the magnetic field nor the uniformity of the deposition process, but in position with respect to the target as to collect electrons not captured by the magnetic field and that otherwise would impinge upon and heat a substrate supported by the work supporting station, and c. withdrawing energy from the anode.

Preferably, the anode is carried generally centrally (but out of) the oval pattern, although the anode can also be carried to the side of the oval pattern. Energy may be withdrawn from the anode by means of external fluid cooling and/or by conduction of electrons away from the anode, as well as by radiation.

DETAILED DESCRIPTION OF THE PREFERRED EMBODIMENT

Figure 1:
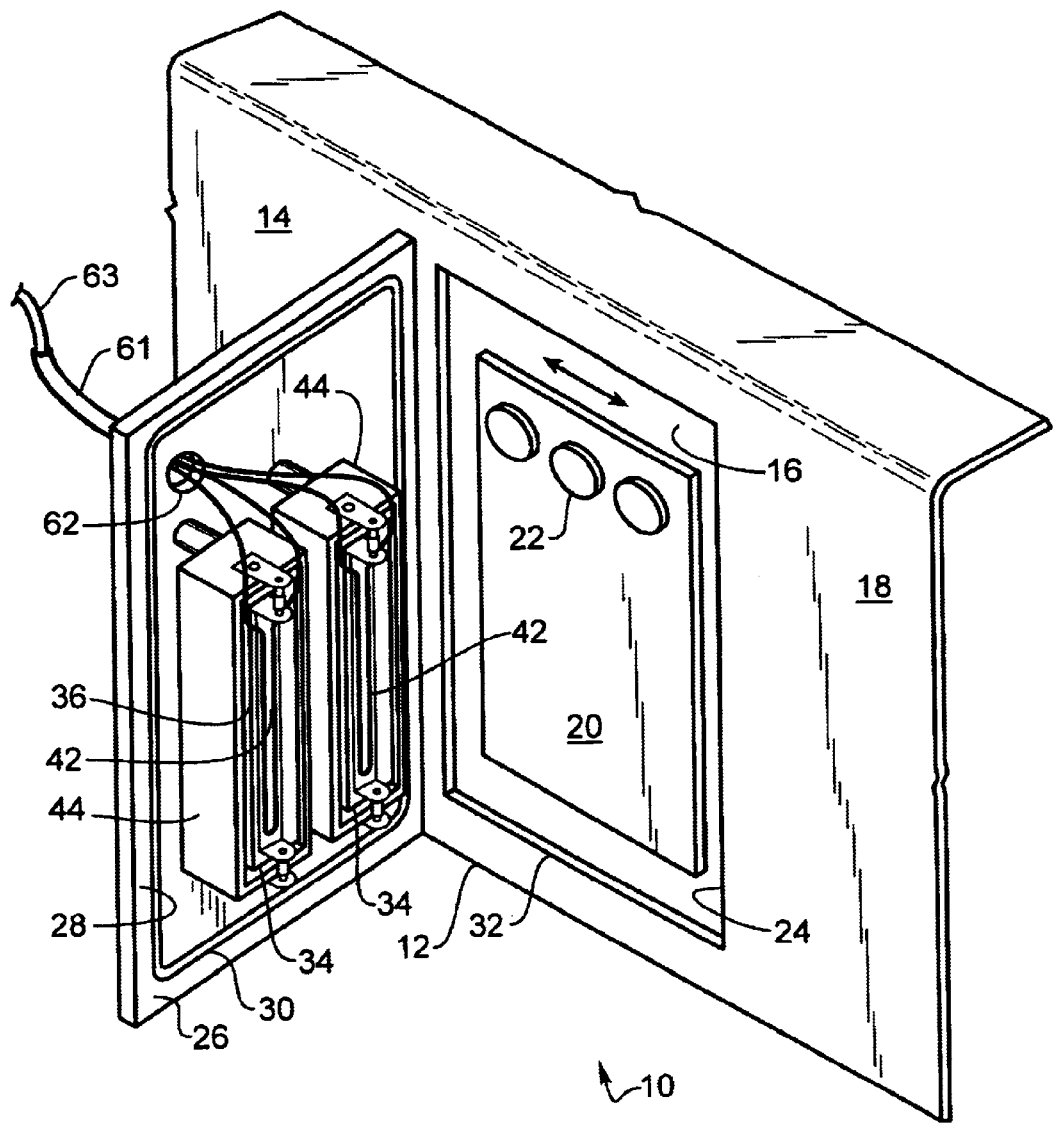
FIG. 1 is a broken-away perspective representation of a magnetron sputtering apparatus.

Referring first to FIG. 1, a coating apparatus 10 is shown comprising a vacuum chamber 12 of known design, the vacuum chamber 12 including pumping devices for producing a vacuum in the chamber and a gas dispensing system for bleeding gases such as argon or oxygen into the vacuum chamber 12 as needed (not shown). Any of a variety of vacuum chamber configurations for magnetron sputtering may be employed, and the vacuum chamber 12 is typical of such sputtering configurations in which the surface of the object to be sputter coated is supported in a generally vertical position, and although the vertical orientation is preferred, chamber configurations in which the substrate is supported in a horizontal or other configuration could be used as well.

The vacuum chamber 12, as shown, may be divided into three aligned enclosures, enter chamber 14, central process chamber 16 and exit chamber 18, which communicate with each other. A vertical motor driven platen 20 capable of supporting the object or objects to be coated is mounted on a rail system within the vacuum chamber 12, and may move from one of the end enclosures through the central process chamber 16 and into the other end enclosure. Although all three enclosures are evacuated during use, sputter coating occurs only in the central process enclosure 16. When a surface is to have multiple coatings, the vertical motor driven platen 20 may be caused to move multiple times from one end enclosure to the other, with a single coating being deposited each time the platen moves across the central process chamber 16. Lens blanks to be coated are shown generally as 22, and are supported on the vertical motor driven platen 20 as in the manner shown in FIG. 1.

The central process chamber 16 is accessible through a doorway 24, the doorway 24 providing access to the vertical motor driven platen 20 so that the lens blanks 22 can be loaded and unloaded from the vertically motor driven platen 20. The doorway 24 is closed by a pivoting door 26, the doorway 24 having an inner wall surface 28 bearing a resilient bead 30 of rubber or other appropriate material which can seal tightly to the outer wall 32 of the central process chamber 16 when the pivoting door 26 is swung closed. Supported on the inner wall surface 28 are a pair of sputtering targets 34, which may be different or essentially identical, in which case they could be replaced by a single target, if desired.

Figure 2:
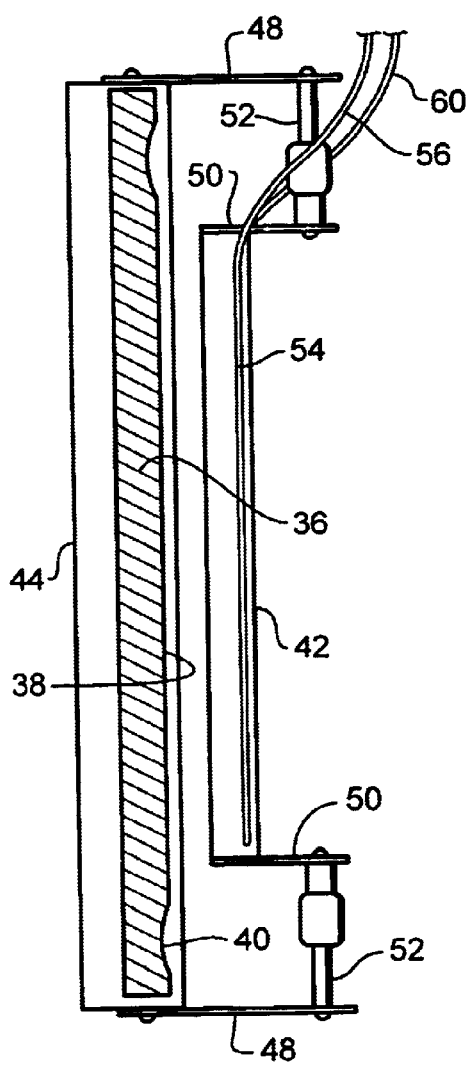
FIG. 2 is a broken-away side view, in partial cross section, of a magnetron target together with an externally cooled anode, as used in the apparatus of FIG. 1.
Figure 3:
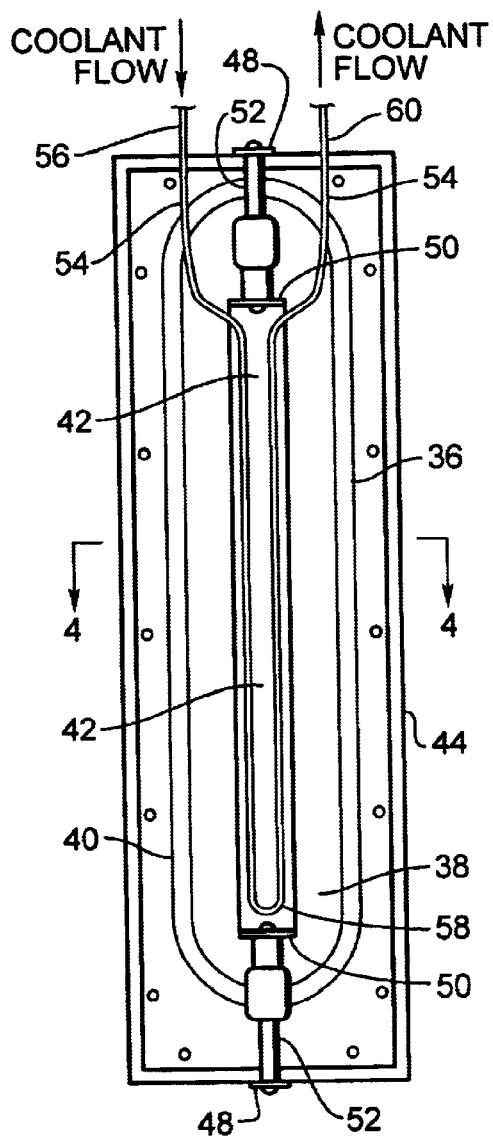
FIG. 3 is a front view, partially broken away, depicting the target and anode of FIG. 2.

Referring particularly to FIGS. 2 and 3, the planar sputtering target 36 may be generally parallelepiped in shape, with a front surface target face 38 facing the vertical motor driven platen 20 when the door is closed. Planar sputtering targets 36 are of known design, and due to the positioning of magnets (not shown) behind the planar sputtering targets 36 develop an oval or racetrack-shaped groove designated 40 and spaced inwardly slightly from the edges of the planar sputtering target 36.

The oval groove 40 is formed by the loss of target material from the planar sputtering target 36 during sputtering operations in which a corresponding oval-shaped gas plasma cloud supported by the magnetic field serves to eject target material from the planar sputtering target 36 toward the objects to be coated.

The sputtering apparatus thus far described in connection with the planar sputtering target 36 is known in the art, and need not be described in greater detail. Moreover, although the magnetron sputtering targets exemplified above are planar targets, it will be evident that cylindrical targets of the type known in the art also can be employed with the invention.

Figure 4:
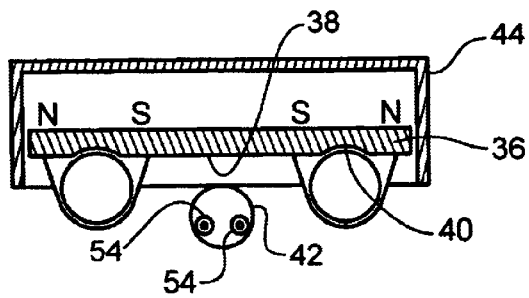
FIG. 4 is a partial cross-sectional view through section 4—4 of FIG. 3.
Figure 5:
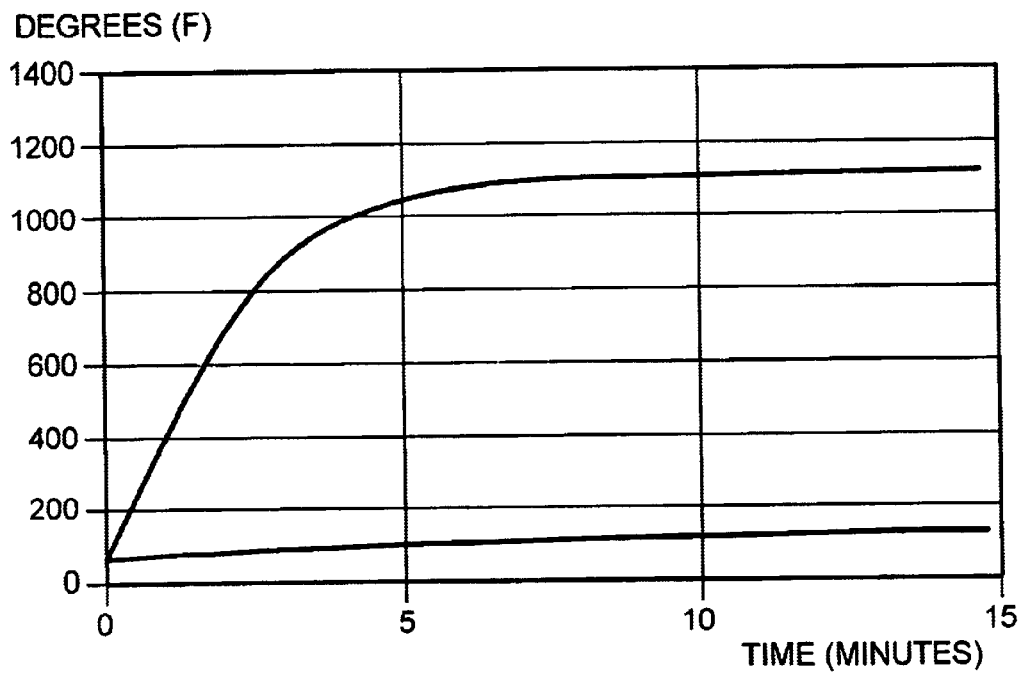
FIG. 5 is a graph comparing the temperature rise at a fixed point in the plasma generated within a magnetron sputtering device of the invention with (lower curve) and without (upper curve) an externally fluid-cooled anode.

Referring now particularly to FIGS. 2—4, an anode is shown generally as 42. The anode 42 may be made of copper, titanium, tantalum, carbon, or other electrically conductive material, preferably a metal, and, as depicted, is desirably elongated and cylindrical in shape, the length of the anode being such as to enable it to extend through the majority of the length of the target.

In this particular embodiment, the anode 42 is positioned generally centrally of the oval-shaped plasma cloud and is spaced from the planar sputtering target 36 in the direction of the substrate.

The planar sputtering target 36 itself is supported in an exterior housing 44. Supporting ground side straps 48 extend forwardly from the top and bottom surfaces of the housing, as shown best in FIG. 2. A pair of similar electrical side straps 50 extend forwardly from the ends of the anode 42, and an electrical insulating connector 52 joins the forward ends of the ground side strap 48 and the electrical side strap 50 to support the anode 42 in a proper position with respect to the planar sputtering target 36. The anode 42 is thus electrically insulated from the planar sputtering target 36 or ground, but is connected to the positive side of the power supply.

If used without external fluid cooling, the anode preferably is fabricated from a metal that itself has a low sputtering rate. The anode 42 itself may become quite hot, to the point of glowing, and energy is carried away from the anode 42 by the conduction of electrons away from the anode 42, by radiation, etc., to establish an energy balance over the anode 42 that prevents anode 42 damage. Although a variety of metals may be employed, titanium and tantalum are preferred since they have low sputtering rates and also because they are largely impervious to the erosion effects of the plasma.

In a preferred embodiment, the anode 42 is externally cooled by means of a metal water tube that is supplied with cold water or other cooling fluid externally of the coating chamber. The cooling tube, shown as 54, extends along the length of the anode 42 and may conveniently be formed of copper. Desirably, the surface of the anode 42 is provided with a groove within which the tube may nest, to provide for good heat transfer of heat from the anode body to the cooling tube 54. As shown in FIGS. 2 and 3, the cooling tube 54 extends from its cooling tube inlet 56 downwardly along the side of the anode 42, and then doubles back in a U-shaped fashion, as shown in FIG. 3 at upward bend 58 to extend upwardly along the side of the anode 42, terminating in a cooling tube outlet 60. It will be understood that a variety of configurations for the cooling apparatus may be employed in addition to those typified above. For example, the anode itself may be provided with one or more interior chambers through which a cooling fluid may flow, or the anode itself may be tubular.

The cooling tube inlet 56 and cooling tube outlet 60 of the cooling tube 54 extend outwardly through a sealed, electrically insulated port 62 in the pivoting door 26. Assuming the cooling tubes 54 are made of metal, electrical contact with the cooling tubes 54 and hence with the anodes 42 can be had by electrically connecting the positive side of an appropriate power supply to the cooling tubes 54 where they exit the pivoting door 26. The cooling tubes 54 desirably are joined to long, non-conductive plastic tubes 61 of polyethylene or the like, which in turn circulate water or other cooling fluid from a cooling fluid source 63 through the cooling tubes 54 to cool the anodes 42. If water is used, it is desirably treated with biocidal materials to restrain growth of biological materials. Within a non-conducting plastic tube, water generally loses its ability to conduct electricity when the tube length is on the order of four feet or greater, and hence no special care need be taken to electrically insulate the cold-water source.

It will be understood by those skilled in the art that magnetron sputtering devices of the type described are powered by power sources that deliver current to the targets. One may use alternating current power sources, or direct (continuous or pulsed) power sources, or one may use radio frequency (e.g., 13.56 MHz) power sources. The relative potential, and polarity, of the anode and cathode are both controlled by the power source (not shown), such that polarity can be momentarily reversed to clean the anode of sputtered on material by means of bias sputtering.

The anode 42 is positioned between the planar sputtering target 36 and the object to be sputtered (lens blank 22 in FIG. 1) but must be so oriented and configured as to be sufficiently out of the magnetic field produced during sputtering as to produce no significant effect upon the magnetic field or sputtering erosion patterns that are formed. On the other hand, the anode must be positioned sufficiently near the target as to collect primary electrons that otherwise would impinge upon and heat the substrate. The oval pattern formed in the front face 38 of a planar target provides a visual indication of the position of the oval-shaped plasma cloud that forms during a sputtering operation. A schematic representation of this cloud is presented in FIG. 4, together with one position of an anode.

The positioning of the anode with respect to the magnetic field and with respect to the target is key to the successful operation of the anode. As noted above, the anode must be close enough to the target so as to collect electrons that otherwise would impinge upon and heat the substrate to be coated, but at the same time the anode must be spaced from the magnetic field that is generated so as not to produce any significant effect upon the sputtering erosion patterns; that is, so as to produce substantially no effect upon the magnetic field or upon the uniformity of the sputtered coating.

One preferred position of an anode is shown in FIGS. 2, 3 and 4, in which the anode is positioned generally centrally over the racetrack-shaped magnetic field. Note, in FIG. 2, that the ends of the elongated anode 42 (to which are attached the electrical side straps 50) do not extend over the oval groove 40 in the target. From FIG. 3, it will be noted that the sides of the anode are spaced inwardly of the oval sections.

Figure 6:
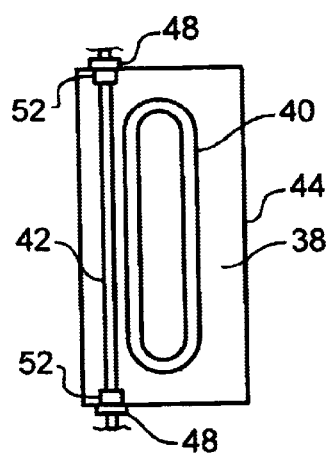
FIG. 6 is a broken-away schematic view of an embodiment of the invention showing the anode outside the oval groove.
Figure 7:
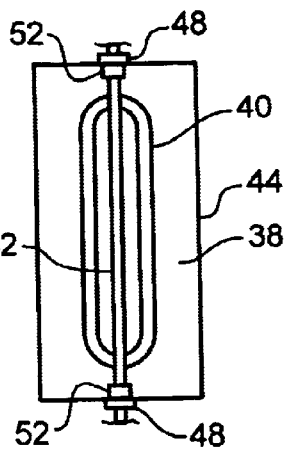
FIG. 7 is a broken-away schematic view of an embodiment of the invention showing the anode located within the oval groove.
Figure 8:
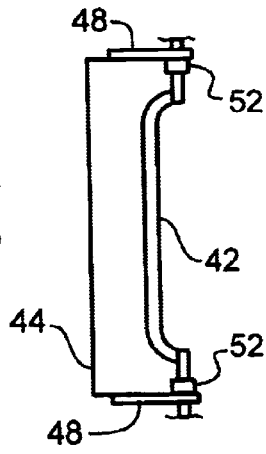
FIG. 8 is a side view of the embodiment of FIG. 7.

Other positions of an anode are shown schematically in FIGS. 6, 7 and 8. The anodes 42 in these figures are typified as lengths of ¼ inch copper tubing or other metal tubing that are supported from the target exterior housing 44 by electrical insulating connectors 52. The tubing may be supplied with a cooling fluid at one end, with the cooling fluid flowing through the tubing and being withdrawn at the other end. As with the apparatus of FIGS. 1 through 4, the tubes may lead through a wall of the sputtering chamber and there be connected to a source of coolant. In a simple version, water from a tap, such as depicted in FIG. 1 as 63, is flowed through a length of plastic tubing having a length greater than about four feet, the plastic tubing being connected to one of the anode tubes externally of the chamber. Another plastic tube may be connected exteriorly to the other end of the anode tubing that protrudes externally from the chamber to receive and discharge slightly heated water.

In FIG. 6, the anode 42 is spaced slightly to the side of the oval-shaped erosion pattern in the target, again in position to collect primary electrons but to avoid interference with the magnetic field. This position is preferred when the target is silicon, since generally less heat is generated and hence fewer electrons need to be captured by the anode. In FIG. 7, the anode is positioned directly over, that is, centrally of, the oval-shaped erosion pattern but far enough away from the target so as not to interfere with the magnetic field. This position is preferred for targets of such metals as titanium and niobium inasmuch as these targets generate comparatively greater amounts of heat. A side view of FIG. 7 is shown schematically in FIG. 8. Electrical insulating connectors 052 are employed to insulate the anode from ground and from the target. Although the invention has been described with respect to a single elongated anode per target, it should be understood that more than one anode could be used, if desired.

The positions of the anodes may be adjusted with respect to the nature and chemistry of the coating to be produced in order to optimize the coating process and, of course, to enable the anodes to collect primary electrons while having no effect upon the magnetic fields. A variety of adjustment means may be employed. The supports carrying the anodes may be adjusted to move the anode with respect to the target. The supports may be reshaped. For example, in the embodiment of FIGS. 1–4, the straps supporting the anode may be bent, lengthened or shortened, or the straps may themselves be moved, to reposition the anode with respect to the target. In the embodiments of FIGS. 6–8, the tubes forming the anodes may themselves be bent as desired into a desired position with respect to the target and the magnetic field. It is preferred to first adjust the atmosphere in the sputtering chamber (vacuum, ratio of gases) before making adjustments to the position of the anode. Of course, it will be understood that the shapes of the anodes may be varied as desired.

In use, a temperature-sensitive substrate such as ophthalmic lens blanks 22 are mounted to the vertical motor driven platen 20, using any convenient fasteners such as edge-clips (not shown). The vertical motor driven platen 20 is then moved into one of the end chambers, aligned enclosure enter chamber 14 or exit chamber 18, the pivoting door 26 is closed and sealed, and an appropriate vacuum is drawn within the chamber. Depending upon the nature of the coating to be deposited, the interior of the vacuum chamber may contain a small amount of argon if the atmosphere within the chamber is to be non-reactive, or may carry a small amount of oxygen, nitrogen, etc. if a reactive atmosphere is to be employed to coat oxides or nitrides of the metals of the target.

The power supply is switched on, causing formation of the appropriate racetrack-shaped plasma cloud, and cooling fluid is flowed through the cooling tubes 54 to cool the anode 42, which has been carefully positioned in the chamber as described above. The vertical motor driven platen 20 then is passed back and forth from one end enclosure to the other as many times as is necessary to build up the desired thickness of coating on the substrate. If more than one type of coating is involved, the sputtering targets 34 and sputtering targets 36 may be replaced with other targets of the desired material.

As an example, eyeglass lens blanks made of, e.g., polycarbonate or high index of refraction plastics, may be mounted to the platen to receive an anti-reflective coating, which is provided by applying alternate layers of materials having substantially differing indices of refraction. For example, utilizing a substrate having an index of refraction of about 1.50, one may apply first a coating of $SiO_2$, having an index of refraction of about 1.47, and alternating this layer with layers of $TiO_2$ which have indices of refraction of about 2.30. The $SiO_2$ coating may be formed using a silicon target in an atmosphere containing a small amount of oxygen, and the $TiO_2$ oxide film can be formed utilizing a titanium target in an oxygen-containing atmosphere. In this manner, a typical antireflective coating consisting of (from the lens surface outwardly) $SiO_2$ (900 Å), $TiO_2$ (70 Å), $SiO_2$ (350 Å), $TiO_2$ (900 Å), and $SiO_2$ (750 Å) can be formed. As is known in the art, a variety of other sputtering materials may be employed as well, including oxides of niobium, zinc, aluminum, indium and tin, and nitrides of silicon, titanium, tantalum, yttrium, zirconium and vanadium.

Although the invention has been described above primarily in connection with planar magnetron targets, cylindrical magnetron sputtering targets also can be employed. These targets carry within them stationary magnets producing a stationary, generally horseshoe-shaped plasma cloud on the outer surface of the cylindrical target. The externally cooled anode of the invention is then mounted adjacent the exterior of the cylindrical target in the manner described above, that is, such that it does not have any significant effect upon the magnetic field, but yet is close enough to the target to collect electrons that otherwise would impinge upon and heat a substrate to be coated.

Figure 9:
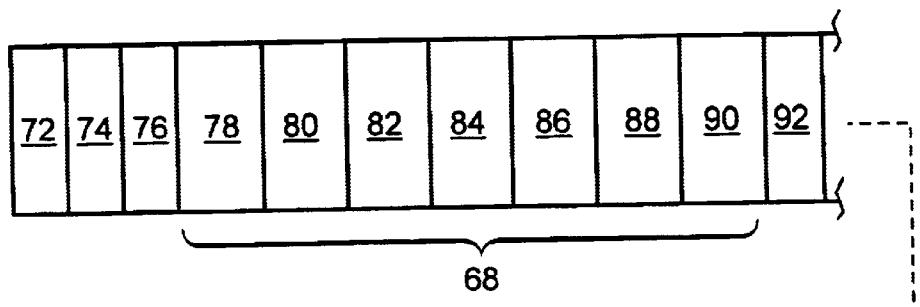
FIG. 9 is a schematic representation of a continuous coating line.

FIG. 9 is a schematic representation of a continuous coating line or inline process in which the substrate to be coated moves from left to right through a plurality of chambers 70 generally, comprising enter lock 72, and chambers designated as 74, 76, 78, 80, 82, 84, 86, 88, 90, buffer 92, sputtering coating side 2 cambers 94, buffer zone 96, and exit lock 98. The substrate may be a temperature-sensitive material such as plastic ophthalmic lenses mounted on a platen that is movable through the chambers 70. For example, the platen could be suspended on an overhead rail and movable by means of a motor-driven chain or the like. Preferably, the platen moves continuously, at constant velocity, through the coater. In the embodiment of FIG. 9, the lenses or other substrates are mounted so that each of their opposing surfaces to be coated is exposed to enable that surface to be coated. For example, if the targets are mounted vertically along the walls of the chambers, the substrates may be supported vertically in openings formed in the vertical platen so that each side of the substrates can be coated, as described below.

A vacuum is drawn within the chambers of the coating line, except the initial enter lock 72. Upon entry of the platen into the initial enter lock 72, a vacuum is drawn in that lock and a gas-tight entryway is opened to permit the platen to move sequentially into chambers 74 and 76 to enable the substrates to be heated and cleaned by plasma etching. As the platen moves sequentially through chambers 70, one surface of the substrates is sequentially coated with $SiO_2$, $TiO_2$, $SiO_2$, $TiO_2$ and $SiO_2$ films in sputter coating side 1 chambers 68. To increase the thickness of a film, the same film may be applied in two or more successive chambers. For example, chambers 84 and 86 both apply $TiO_2$ films, and chambers 88 and 90 both apply $SiO_2$ films. The platen then passes through a buffer zone 92 and into another series of chambers, designated for simplicity as 94, wherein the same or another coating is applied to the other surface of the substrates in sputter coating side 2 chambers 94. The series of chambers 94 may, if desired, be the same as the chambers 68. The platen then moves through buffer zone 96 and exit lock 98, to emerge from the coating line. In practice, of course, a series of platens would move in succession through the coating line.

While a preferred embodiment of the present invention has been described, it should be understood that various changes, adaptation and modifications may be made therein without departing from the spirit of the invention and the scope of the appended claims.

What is claimed is:

1. Apparatus for cathodic magnetron sputtering of a temperature-sensitive substrate comprising:
   a vacuum chamber having a work-supporting station;
   a magnetron sputtering target in sputtering opposition to said work-supporting station, said apparatus producing a magnetic field serving to contain, in an oval pattern, a gas plasma cloud, the gas plasma cloud serving to eject target material toward said work-supporting station;
   at least one anode carried adjacent the oval pattern and sufficiently out of said magnetic field so as to have no significant effect upon said magnetic field or sputtering uniformity, said at least one anode being so positioned with respect to said magnetron sputtering target as to collect electrons that otherwise would impinge upon and heat a substrate supported by said work-supporting station; and
   movable supports for adjusting the position of said at least one anode with respect to said magnetron sputtering target.

2. The apparatus of claim 1 including an external source of liquid coolant for supplying said liquid coolant to said at least one anode, said anode including coolant inlet and outlet conduits and said at least one anode being electrically insulated from said magnetron sputtering target.

3. The apparatus of claim 2 including metal tubing in heat-transferring contact with said at least one anode and communicating with said external source of liquid coolant.

4. The apparatus of claim 3 wherein said metal tubing is in electrical contact with said at least one anode.

5. The apparatus of claim 2 wherein said at least one anode has an internal chamber in fluid flow communication with said external source of liquid coolant.

6. The apparatus of claims 5 wherein said at least one anode is tubular.

7. The apparatus claim 1 wherein said magnetron sputtering target is a planar target.

8. The apparatus of claim 1 wherein said magnetron sputtering target is a cylindrical target.

9. The apparatus of claim 1 wherein said at least one anode is positioned centrally of said oval pattern.

10. The apparatus of claim 1 wherein said at least one anode is positioned to the side of said oval pattern.

* * * * *